United States Patent
Zhang et al.

(10) Patent No.: US 10,069,100 B2
(45) Date of Patent: Sep. 4, 2018

(54) FLEXIBLE DEVICE WITH DECOUPLED DISPLAY LAYERS

(71) Applicant: Apple Inc., Cupertino, CA (US)

(72) Inventors: Zhen Zhang, San Jose, CA (US); Paul S. Drzaic, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 34 days.

(21) Appl. No.: 15/234,416

(22) Filed: Aug. 11, 2016

(65) Prior Publication Data

US 2017/0092892 A1 Mar. 30, 2017

Related U.S. Application Data (60) Provisional application No. 62/232,196, filed on Sep. 24, 2015.

(51) Int. Cl.

| | | |
|---|---|---|
| *H01L 51/52* | (2006.01) | |
| *H01L 51/00* | (2006.01) | |
| *G06F 1/16* | (2006.01) | |
| *G09F 9/30* | (2006.01) | |
| *H04M 1/02* | (2006.01) | |

(52) U.S. Cl.
CPC ........ *H01L 51/5237* (2013.01); *G06F 1/1652* (2013.01); *G09F 9/301* (2013.01); *H01L 51/0097* (2013.01); *H01L 51/525* (2013.01); *H01L 51/5246* (2013.01); *H04M 1/0268* (2013.01); *G06F 2203/04102* (2013.01); *H01L 2251/5338* (2013.01)

(58) Field of Classification Search
CPC ............ H01L 51/5237; H01L 51/0097; H01L 51/5246; H01L 51/525
See application file for complete search history.

(56) References Cited

U.S. PATENT DOCUMENTS

| | | |
|---|---|---|
| 9,051,493 B2 | 6/2015 | Bower et al. |
| 9,189,028 B2 | 11/2015 | Nakhimov |
| 2003/0214612 A1 | 11/2003 | Freeman |
| 2006/0204675 A1 | 9/2006 | Gao et al. |

(Continued)

FOREIGN PATENT DOCUMENTS

| | | |
|---|---|---|
| JP | 2002341792 | 11/2002 |
| WO | 2010019466 A1 | 2/2010 |

*Primary Examiner* — Fernando L Toledo
*Assistant Examiner* — Neil Prasad
(74) *Attorney, Agent, or Firm* — Treyz Law Group, P.C.; G. Victor Treyz; Kendall W. Abbasi (57) ABSTRACT

An electronic device may have a display. The device and display may bend about a bend axis. The display may have layers such as an organic light-emitting diode layer or other layer with pixels, a touch sensor layer, a protective layer with a polarizer, and a support layer. Lubrication layers formed from textured surfaces, slippery coatings, and lubricants such as oil may be interposed between the layers of the display so that the display layers slip past each other during bending of the device and display and minimize display stress. A device housing may have a recess or other structures that retain the display within the housing while allowing the display layers to shift relative to each other during bending. Elastomeric gaskets and elastomeric lubricant retention structures may be used to mount the display layers in the housing and to retain liquid lubricant within the layers of the display.

19 Claims, 9 Drawing Sheets

(56) References Cited

U.S. PATENT DOCUMENTS

| | | | |
|---|---|---|---|
| 2011/0019351 A1* | 1/2011 | Bayne | G02F 1/133308 361/679.01 |
| 2013/0083496 A1* | 4/2013 | Franklin | G06F 1/1626 361/749 |
| 2014/0042406 A1 | 2/2014 | Degner et al. | |
| 2015/0077363 A1* | 3/2015 | Yairi | G06F 3/016 345/173 |
| 2015/0293403 A1 | 10/2015 | Lee et al. | |
| 2016/0037608 A1* | 2/2016 | Ikeda | H05B 33/12 362/235 |
| 2016/0224066 A1* | 8/2016 | Hussa | G06F 1/1652 |

* cited by examiner

FLEXIBLE DEVICE WITH DECOUPLED DISPLAY LAYERS

This application claims the benefit of provisional patent application No. 62/232,196, filed Sep. 24, 2015, which is hereby incorporated by reference herein in its entirety.

BACKGROUND

This relates generally to electronic devices, and, more particularly, to electronic devices with displays.

Electronic devices often include displays for presenting images to a user. Displays are typically formed from rigid planar substrates. Although satisfactory in many situations, rigid displays such as these may be difficult to integrate into certain devices, such as devices with bendable housings.

It would therefore be desirable to be able to provide improved displays for electronic devices.

SUMMARY

An electronic device may have a display. The device and display may bend about a bend axis. The display may have flexible layers to accommodate bending.

The display layers may include layers such as an organic light-emitting diode layer or other layer with pixels, a touch sensor layer, a protective layer with a polarizer, and a support layer. Lubrication layers formed from textured surfaces, slippery coatings, and lubricants such as oil or other liquids may be interposed between the layers of the display so that the display layers slip past each other during bending of the device and display. This helps prevent stress from building up in the display as the display bends and therefore allows the display to bend without damage.

The electronic device may have a housing in which the display is mounted. The housing may have a recess that receives the edges of the display or may have other structures that help retain the display within the housing while allowing the display layers to shift relative to each other during bending. Elastomeric gaskets and elastomeric lubricant retention structures may be used to mount the display layers in the housing and to retain liquid lubricant within the layers of the display. Anchors may be used to hold display layers together during bending. An anchor may, as an example, bridge a layer of liquid lubricant that is interposed between adjacent displayer layers and may overlap the bend axis.

Further features will be more apparent from the accompanying drawings and the following detailed description.

DETAILED DESCRIPTION

Figure 1:
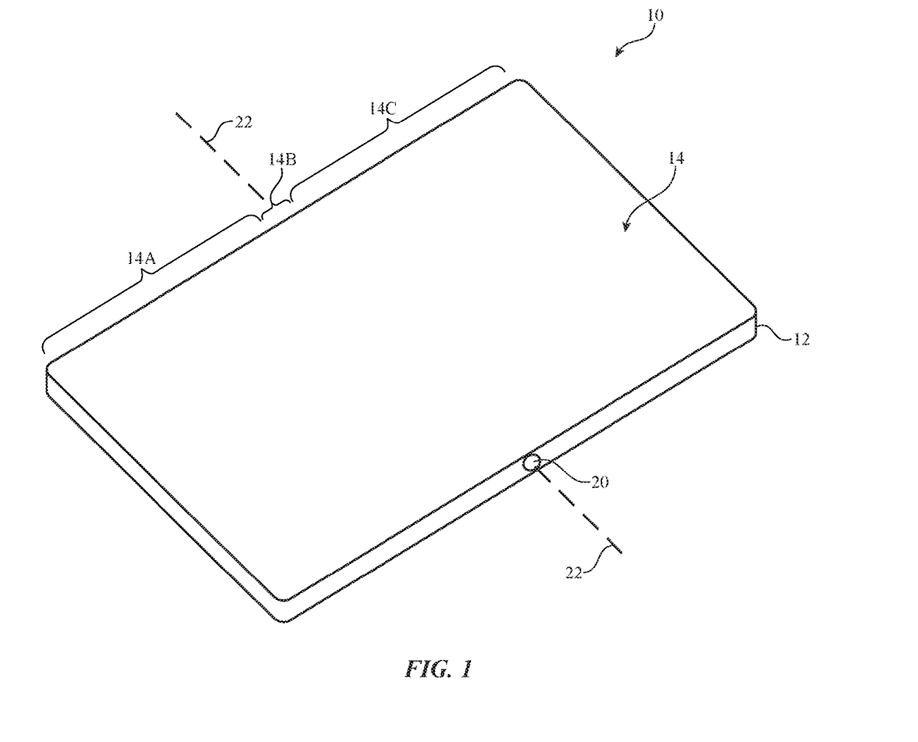
FIG. 1 is a perspective view of an illustrative electronic device having a flexible display in accordance with an embodiment.

An illustrative electronic device of the type that may be provided with a flexible display is shown in FIG. 1. Electronic device 10 may be a computing device such as a laptop computer, a computer monitor containing an embedded computer, a tablet computer, an electronic book, a cellular telephone, a media player, or other handheld or portable electronic device, a smaller device such as a wrist-watch device, a pendant device, a wearable or miniature device of other types, a computer display that does not contain an embedded computer, a computer display that includes an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, electronic book, watch or other wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Housing 12 may have hinge structures such as hinge 20 to allow device 10 to fold or otherwise bend about bend axis 22 (sometimes referred to as a fold axis, hinge axis, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch sensor electrodes for display 14 may be formed from an array of indium tin oxide pads or other transparent conductive structures, metal electrode structures in a display layer, or other conductive electrode structures. A touch sensor may be formed using electrodes or other structures on a display layer that contains a pixel array or on a separate touch panel layer that is attached to the pixel array (e.g., using adhesive).

Display 14 may include pixels formed from liquid crystal display (LCD) components, electrophoretic pixels, microelectromechanical (MEMs) shutter pixels, electrowetting pixels, micro-light-emitting diodes (small crystalline semiconductor die), organic light-emitting diodes (e.g., a thin-film organic light-emitting diode display), quantum dot light-emitting diodes, or pixels based on other display technologies. Configurations in which display 14 is a light-emitting diode display such as an organic light-emitting diode display may sometimes be described herein as an example.

Center portion 14B of display 14 (and, if desired, some or all of the remaining portions of display 14) may be flexible to allow display 14 (e.g., rigid outer display portions 14A and 14C) to be bent along bend axis 22 of device 10. Display 14 may include multiple layers. The layers of display 14 may include one or more layers such as an outer protective layer with a polarizer, a touch panel layer, a thin-film transistor layer containing thin-film transistor circuitry and associated organic light-emitting diodes or other pixels on a polymer substrate, and a supporting backing layer. More display layers or fewer display layers and/or different types of layers may be included in display 14, if desired.

Display layers may be formed from plastic (polymer), glass, metal, or other suitable materials. When constructed from sufficiently thin layers of material (e.g., 20 microns or less, 30 microns or less, 50 microns or less, 1-40 microns, or other suitable thicknesses), the display layers will not generally experience potentially damaging plastic deformation or cracking. In a display configuration with multiple thin layers such as these, display 14 may therefore be bent back and forth about a bend axis without damaging display 14.

To prevent adjacent thin layers of display 14 from sticking to each other and thereby increasing undesired stresses within the display layers, adjacent layers of display 14 may be separated by structures that allow the layers to slip past each other during bending. For example, adjacent display layers may be separated by slippery structures. The slippery structures may include slippery textured surfaces, surfaces with slippery coatings, slippery materials (lubricants), and/or other non-stick structures. Index-of-refraction-matching oil may be used to suppress reflections between adjacent display layers while providing lubrication. Decoupling the layers of display 14 from each other in this way allows the layers to slide over each other (e.g., one layer may slip past another with a sheering motion) to prevent excess stress from building up in display 14. As a result, tight bends may be formed in display 14 without adversely affecting display 14.

Figure 2:
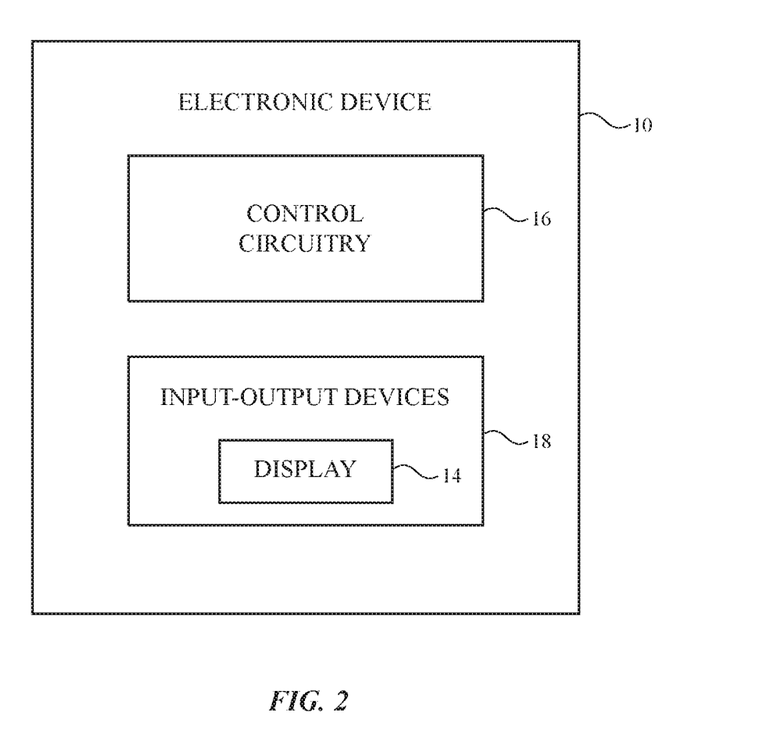
FIG. 2 is a schematic diagram of an illustrative electronic device having a flexible display in accordance with an embodiment.

A schematic diagram of an illustrative electronic device such as device 10 of FIG. 1 is shown in FIG. 2. As shown in FIG. 2, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18. Input-output devices 18 may include a display such as display 14 of FIG. 1.

Control circuitry 16 may be used to run software on device 10 such as operating system code and applications. During operation of device 10, the software running on control circuitry 16 may display images on display 14 (e.g., video, still images such as text, alphanumeric labels, photographs, icons, other graphics, etc.) using an array of pixels in display 14.

Figure 3:
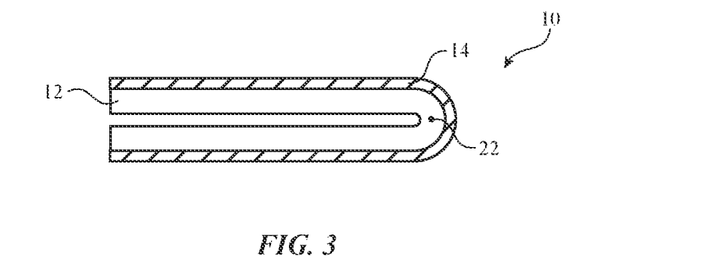
FIGS. 3 and 4 are cross-sectional side views of electronic devices with flexible displays in accordance with an embodiment.
Figure 4:
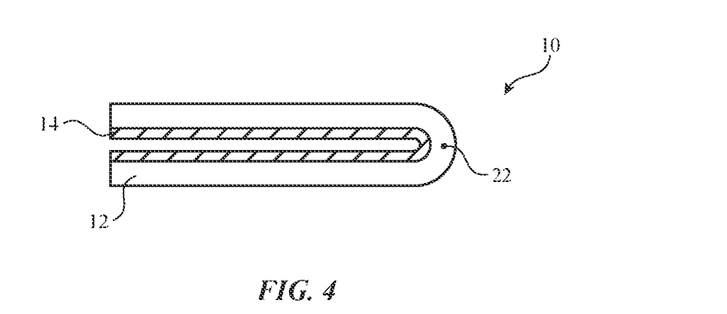

As shown in FIG. 3, device 10 may be folded (bent outwardly by 180° or other suitable amount) about bend axis 22 so that display 14 is visible from the outside of device 10 in its folded state. In this configuration, a first portion of display 14 faces outwardly from one half of device 10 and a second portion of display 14 faces outwardly from another half of device 10 (and faces away from the first portion). FIG. 4 shows how device 10 may be folded inwardly by 180° or other suitable amount about bend axis 22 so that display 14 is protected within the interior of device 10. Device 10 may have hinges that allow outward bending (folding) of the type shown in FIG. 3, that allow inward bending (folding) of the type shown in FIG. 4, or that allow bending of both the type shown in FIG. 3 and the type shown in FIG. 4. Configurations in which device 10 is flexed by different amounts (e.g., more than 180° or less than 180°) may also be used.

Figure 5:
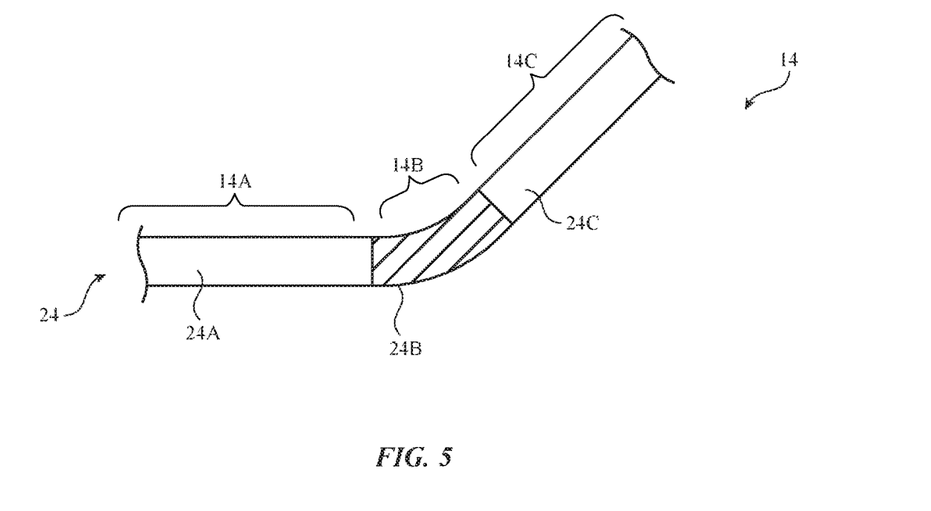
FIG. 5 is a cross-sectional side view of an illustrative display layer with a flexible portion in accordance with an embodiment.

As shown in FIG. 5, the layers of display 14 (i.e., display layers 24) may have outer portions 24A and 24C that are formed on opposing sides of center portion 24B. Outer portions 24A and 24C may be rigid planar layers or may be planar flexible layers. Configurations in which portions 24A and 24C have non-planar shapes (and are rigid or flexible) may also be used. Between portions 24A and 24C of display layers 24, display layers 24 may have a flexible portion such as portion 24B. Portion 24B may bend about bend axis 22 to allow display 14 to bend as housing 12 is bent about hinge 20 (e.g., display portion 14B may bend about axis 22 to allow display portions 14A and 14C to rotate relative to each other).

Figure 6:
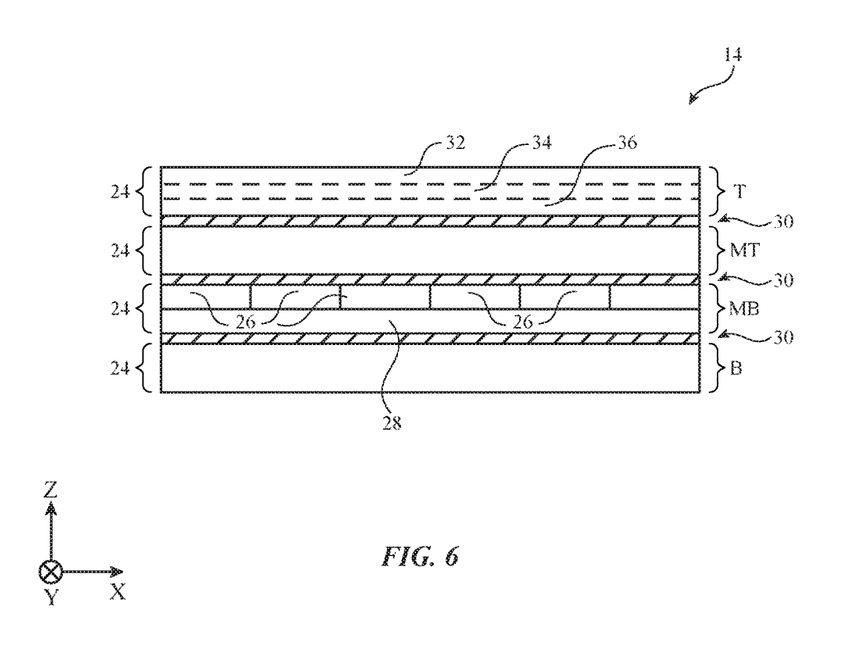
FIG. 6 is a cross-sectional side view of an illustrative flexible display in accordance with an embodiment.

Display 14 may have any suitable number of layers 24. A cross-sectional side view of display 14 in an illustrative configuration in which display 14 has four layers 24 is shown in FIG. 6. If desired, display 14 may have five or more layers 24 or may have fewer than four layers (i.e., two or three). The example of FIG. 6 is merely illustrative.

The bottommost of layers 24 in FIG. 6 (layer B) may be a supporting layer and may be formed from a material such as metal, plastic, or glass (as examples). This layer may provide the other layers 24 in display 14 with structural support, may help protect display 14 from damage (e.g., damage from impact from a hard object, damage from inadvertent twisting, etc.), may help ensure that display 14 is planar, and may otherwise help strengthen and support display 14. The thickness of layer B may be about 20-50 microns, less than 50 microns, less than 30 microns, or other suitable thickness (as an example).

Topmost display layer T of layers 24 may include functional layers such as layer 32 (e.g., a scratch resistant surface of the type that is sometimes referred to as a hardcoat, an antismudge layer, an antireflection layer, an antistatic layer, layers that perform the functions of two or more of these layers, etc.), a polarizer layer (e.g., layer 36), and an interposed supporting layer such as polymer substrate 34. The thickness of layer T may be, for example, about 15-35 microns, less than 50 microns, less than 30 microns, or other suitable thickness.

Layer MB may contain an array of pixels 26 such as pixels based on light-emitting diodes. Layer MB may, for example, include an array of pixels 26 formed from organic light-emitting diodes or other light-emitting diodes on substrate 28. Pixels 26 may include thin-film transistor circuitry (e.g., pixel circuits for controlling the application of current to light-emitting diodes in pixels 26), moisture barrier layers (sometimes referred to as encapsulation layers) that cover the sensitive portions of the pixels, patterned metal lines that form signal interconnects such as data lines and horizontal control lines in the thin-film transistor circuitry, buffer layers that separate the thin-film transistor circuitry from substrate 28, and/or other organic light-emitting diode display layer structures. Layer MB may sometimes be referred to as an organic light-emitting diode layer or pixel layer. The thickness of layer MB may be about 20 to 25 microns, may be less than 50 microns, may be less than 30 microns, or may have any other suitable thickness.

Touch sensor structures may be formed from portions of layer MB (e.g., capacitive touch sensor electrodes may be formed as part of the layers of conductive material in layer MB) or may be formed from a separate touch panel layer such as illustrative touch sensor layer MT. With one illustrative configuration, layer MT includes a polymer substrate with a single-sided or double-sided array of transparent capacitive touch sensor electrodes formed from indium tin oxide, thin (and therefore transparent) metal, or other transparent conductive material. Layer MT of layers 24 may have a thickness of 5-70 microns, 10-25 microns, less than 50 microns, less than 30 microns, or other suitable thickness.

Non-stick structures such as slippery layers 30 may be interposed between adjacent layers 24. Layers 30 may include slippery coatings (e.g., fluoropolymer coatings and/or textured portions) on one or both of the opposing surfaces of a set of adjacent layers 24, may include layers of lubricants such as oils (e.g., index matching oil having an index of refraction that matches that of adjacent display layers to suppress light reflections), may include combinations of these structures (e.g., nanostructures or other textured surfaces and oil or other lubrication that is retained within recesses in the nanostructures or other textured surface structures), may include any other lubricating layers of material that prevent excess friction between adjacent layers, or may include biaxial adhesive layers (e.g., adhesives that hold layers 24 together along orthogonal direction Z while allowing slippage of adjacent layers 24 laterally in dimensions X and Y), or other layers that allow slippage between adjoining layers. Surface tension effects and other effects associated with oils and other liquid lubricants may help hold layers 24 together. Because layers 30 serve as non-stick structures (layers) that prevent layers 24 from sticking to each other, layers 24 can slide (slip) over each other to relieve stress that would otherwise build up in a thicker display formed from layers 24 that are stuck together with stiff adhesive. As a result, damage to display 14 is avoided, even when display 14 is bent about axis 22.

Figure 7:
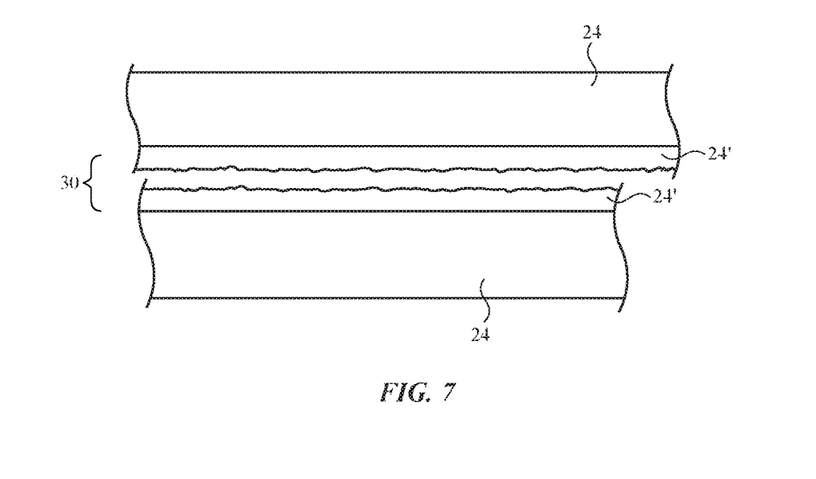
FIG. 7 is a cross-sectional side view adjacent layers in a flexible display in accordance with an embodiment.

FIG. 7 is a cross-sectional side view of a pair of adjacent layers 24 each of which has a non-stick coating layer (layers 24'). Layers 24' may serve as lubrication layer 30 and may be formed from smooth layers of material and/or layers with patterned ridges and/or grooves, round bumps, round depressions, bumps or depressions with straight and/or curved edges, patterned protrusions and/or recesses of other shapes, nanostructures with pseudorandom patterns and/or other patterns, or other textured surfaces that help reduce friction between layers 24. Layers 24' may be formed on one or both of the opposing surfaces of layers 24 and may be separated by air, oil (e.g., index-of-refraction matching oil) or other liquid lubricant, lubricating particles, lubricant having particles suspended in liquid, or other lubricant. If desired, layers such as layers 24' may be formed from materials that are slippery (i.e., non-stick materials) such as polytetrafluoroethylene (e.g., Teflon®), other fluoropolymers, slippery polymers and other materials, and/or other non-stick structures.

Figure 8:
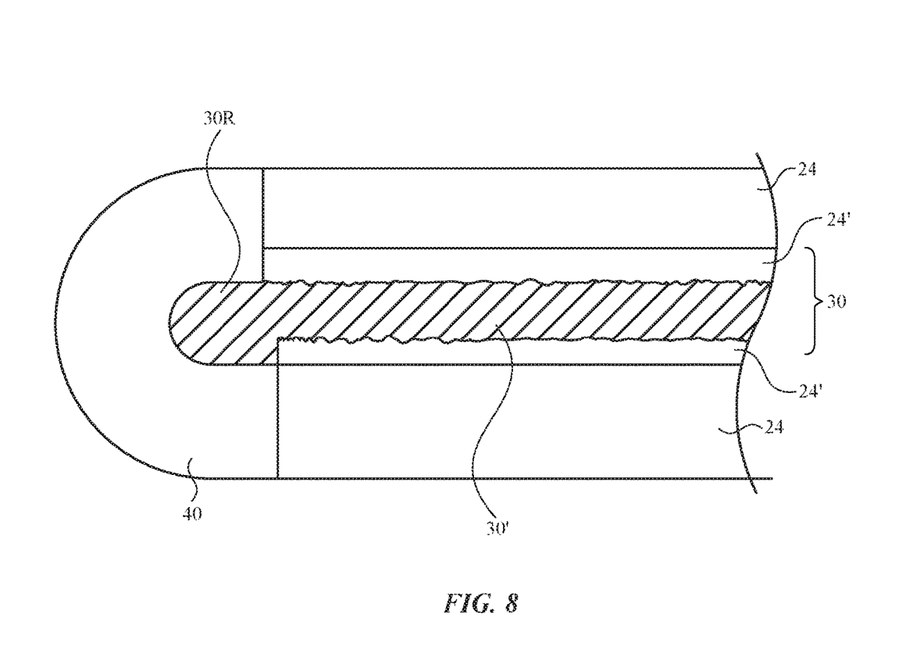
FIG. 8 is a cross-sectional side view of illustrative adjacent layers in a flexible display in a configuration in which a sealing structure such as a lubricant retention structure has been formed along an edge of the display in accordance with an embodiment.

FIG. 8 is a cross-sectional side view of a set of adjacent layers with an intervening slippery layer 30 formed from lubricating layer 30' between coating layers 24' (e.g., slippery coating layers and/or textured coatings for retaining liquid lubricant). Layer 30' may be oil (e.g., index-of-refraction matching oil) or other liquid lubricant, lubricating particles, lubricant having particles suspended in liquid, or other lubricant. Coating layers 24' may be smooth and/or textured layers (e.g., layers such as layers 24' of FIG. 7).

To help retain liquid lubricant within the gap between adjacent layers 24 (e.g., to prevent liquid from escaping laterally), a lubricant retention structure such as structure 40 may be formed along the edge of layers 24 (e.g., along one, two, three, or four or more edges of display 14). Lubricant retention structure 40 may be formed from silicone or other elastomeric material that can accommodate slippage between layers 24 without becoming detached from layers 24. Structures such as lubricant retention structure 40 may have the shape of a solid bead of elastomer that runs along the peripheral edge of display 14 or may, as shown in FIG. 8, have a partially hollow interior portion that serves as a reservoir 30R for liquid lubricant. Other lubricant retention structures (sometimes referred to as edge sealing structures) may be used if desired.

Figure 9:
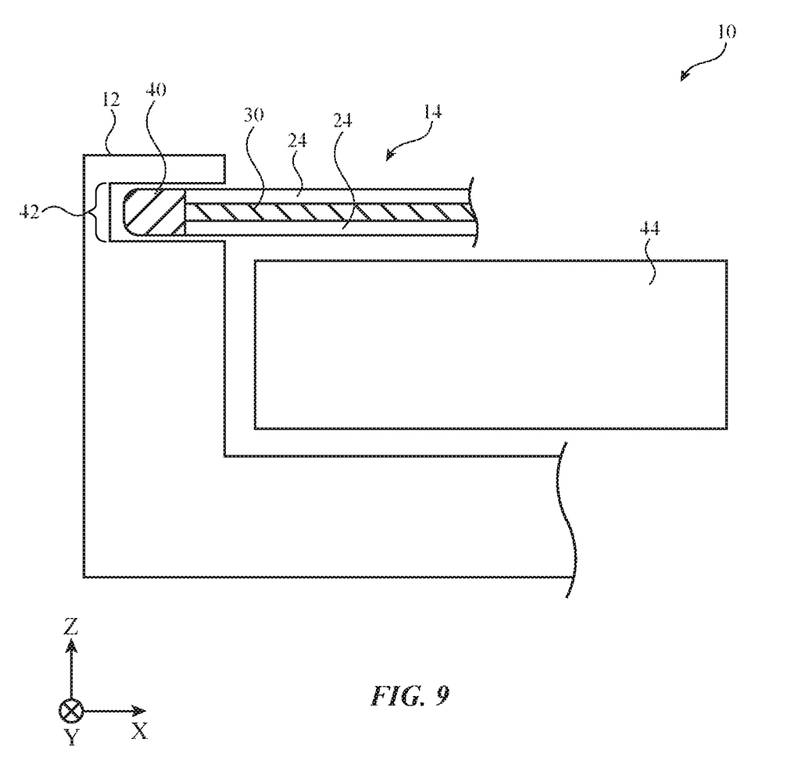
FIG. 9 is a cross-sectional side view of a portion of an electronic device with a display retention groove in accordance with an embodiment.

Device 10 may be provided with structures such as bezel structure or other structures that help retain display 14 within housing 12 and device 10 during bending and lateral movement of layers 24. In the illustrative example of FIG. 9, housing 12 has an interior portion that is used to house internal device components 44 (e.g., integrated circuits, printed circuit boards, input-output devices and control circuitry, a battery, etc.). Housing 12 may also have a sidewall or other portion with a recessed portion such as peripheral inwardly facing housing groove 42. Groove 42 or other recesses in housing 12 may have a shape that retains the edge of display 14 within housing 12 while allowing layers 24 of display 14 to slip laterally back and forth in dimensions X and/or Y during bending of device 10.

When device 10 is bent about bend axis 22, layers 24 of display 14 may slip over one another. Edge features of display 14 such as structure 40 may be formed from a material that can deform to accommodate shifting of the relative positions of the edges of layers 24. This is illustrated in the example of FIGS. 10 and 11.

Figure 10:
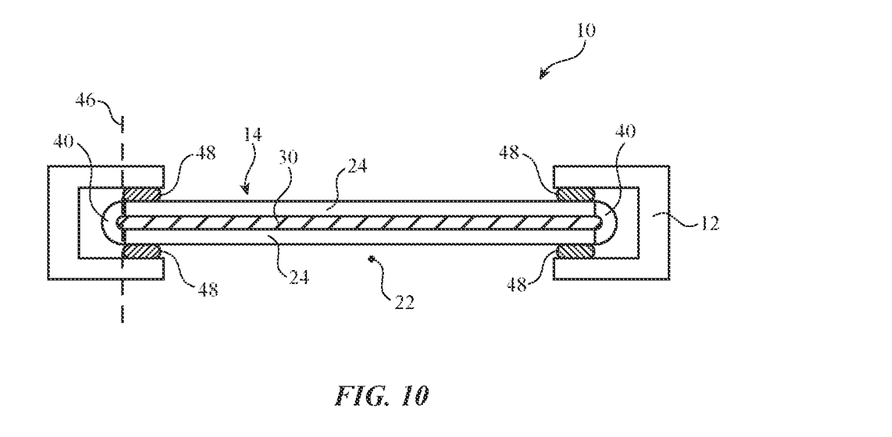
FIG. 10 is a cross-sectional side view of an illustrative display and housing structure in an unbent display configuration in accordance with an embodiment.

In the illustrative configuration of FIG. 10, device 10 is not bent, so display 14 is in a planar state. In this state, the edges 24E of layers 24 may be laterally aligned with each other (e.g., edges 24E may all be aligned along edge location 46 of FIG. 10). Upon bending of device 10 and display 14 about axis 22 of FIG. 11, the edge 24E of the uppermost of layers 24 will be shifted inwardly to position 47 relative to edge position 49 for edge 24E of the lowermost of layers 24, leading to lateral displacement D between the edges 24E of different layers 24.

Structure 40 may be formed from an elastomeric material or other material that can deform to accommodate the lateral shift D between layers 24. If desired, elastomeric gasket material 48 or other structures that can accommodate shifting of layers 24 relative to housing 12 and each other may be incorporated into device 10. The use of elastomeric material or other compliant structures for forming display mounting structures such as gaskets 48 may help relieve stress that might otherwise build up between layers 24 and/or between layers 24 and housing 12 during bending.

Figure 11:
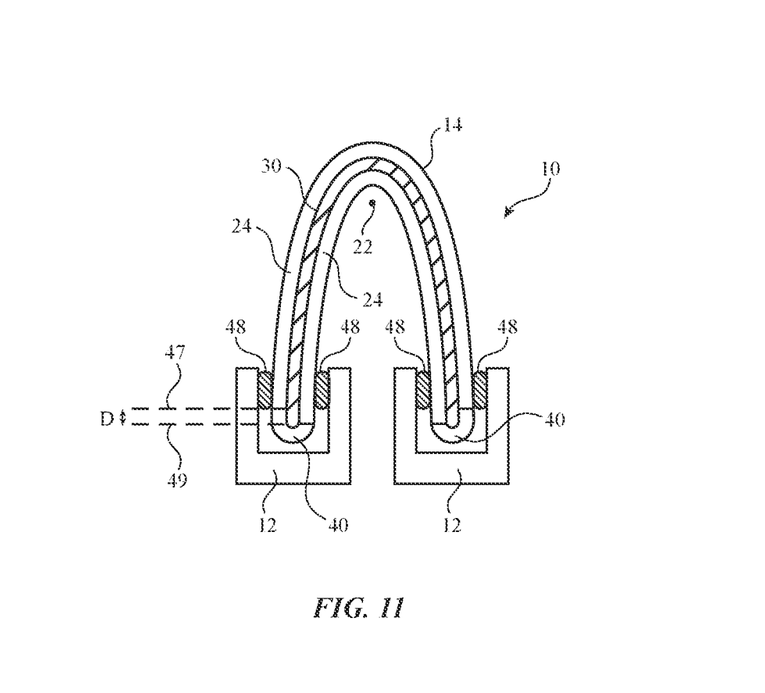
FIG. 11 is a cross-sectional side view of the display and housing structure of FIG. 10 in a bent display configuration in accordance with an embodiment.

The lateral shift that may result between two decoupled layers 24 in display 14 upon bending is illustrated in the example of FIGS. 10 and 11. Elastomeric structures may be used for structures 40 and 48 and/or other structures in device 10 and display 14 to allow layers 24 to slide relative to each other in displays with three or more layers 24 or four or more layers 24. The example of FIGS. 10 and 11 in which display 14 includes two layers 24 is merely illustrative.

Figure 12:
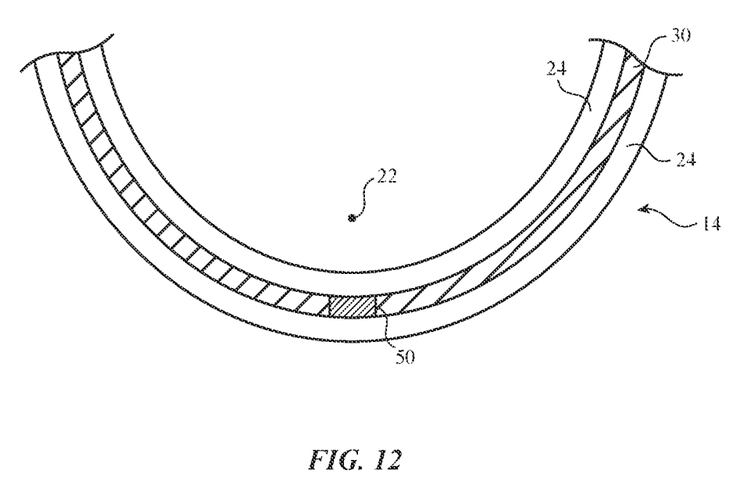
FIG. 12 is a cross-sectional side view of a bent display portion showing how anchor structures may be formed between adjacent layers and may bridge a lubrication layer such as a layer of liquid lubricant in accordance with an embodiment.

Lateral shifts between adjacent layers 24 will generally be minimized in the portion of display 14 overlapping bend axis 22 (e.g., in portion 14B of FIG. 1). If desired, inter-layer anchor structures such as illustrative anchor 50 of FIG. 12 may be used to help hold layers 24 together without defeating the decoupling function provided by layer 30. Anchors such as anchor 50 may have the shapes of strips, dots, rectangles, or other suitable shapes. Anchor 50 of FIG. 12 may, for example, include a single strip or a series of segments separated by small gaps running parallel to bend axis across some or all of the width of display 14. Anchor structures such as anchor 50 of FIG. 12 may bridge lubricant layer 30 to hold adjacent layers 24 together even when layers 24 are bent.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
    a housing that bends about a bend axis;
    a display in the housing that overlaps the bend axis and bends as the housing bends about the bend axis, wherein the display includes display layers separated by at least one layer that allows the display layers to slip past each other as the display bends about the bend axis; and
    first and second gaskets that hold the display layers in place within the housing while allowing the display layers to shift relative to each other as the display is bent about the bend axis, wherein the display layers extend between the first and second gaskets, wherein the display has an upper surface on which images are displayed, a lower surface opposite the upper surface, and an edge interposed between the upper and lower surfaces, wherein the first and second gaskets are separated by a gap that extends along the edge of the display, and wherein the display layers shift within the gap.

2. The electronic device defined in claim 1 wherein the layer that allows the display layers to slip past each other comprises lubricant.

3. The electronic device defined in claim 2 wherein the lubricant comprises liquid lubricant.

4. The electronic device defined in claim 3 wherein the display layers have indices of refraction and wherein the liquid lubricant comprise an oil that is index matched to the indices of refraction of the display layers.

5. The electronic device defined in claim 3 further comprising a lubricant retention structure along at least one edge of the display layers.

6. The electronic device defined in claim 5 wherein the lubricant retention structure is formed from an elastomeric material and is configured to form a reservoir for at least some of the liquid lubricant.

7. The electronic device defined in claim 3 further comprising an anchor structure that overlaps the bend axis and spans the liquid lubricant to hold the display layers together.

8. The electronic device defined in claim 1 wherein the layer that allows the display layers to slip past each other comprises a biaxial adhesive.

9. The electronic device defined in claim 1 wherein the layer that allows the display layers to slip past each other includes a coating on at least one of the display layers.

10. The electronic device defined in claim 9 wherein the coating comprises a fluoropolymer coating.

11. The electronic device defined in claim 9 wherein the coating has a textured surface.

12. The electronic device defined in claim 11 wherein the layer that allows the display layers to slip past each other includes liquid lubricant.

13. The electronic device defined in claim 12 wherein the at least one layer that allows the display layers to slip past each other display layers includes first, second, and third slippery layers and wherein the display layers include:
    a support layer;
    an organic light-emitting diode layer that is separated from the support layer by the first slippery layer;
    a touch panel that is separated from the organic light-emitting diode layer by the second slippery layer; and
    a layer that includes a polarizer and that is separated from the touch panel by the third slippery layer.

14. The electronic device defined in claim 1 further comprising a recess in the housing that retains the display layers while allowing the display layers to slip past each other as the display is bent about the bend axis.

15. A display, comprising:
    at least first and second layers that bend about a bend axis;
    a lubrication layer interposed between the first and second layers that allows the first and second layers to slip past each other as the first and second layers are bent about the bend axis; and
    a lubricant retention structure having a partially hollow interior portion that serves as a reservoir for the lubrication layer, wherein the lubricant retention structure has first and second opposing ends, wherein the first end is coupled to and moves with the first layer, wherein the second is coupled to and moves with the second layer, and wherein the reservoir is interposed between the first and second ends and is aligned with the lubrication layer.

16. The display defined in claim 15 wherein the first layer comprises an organic light-emitting diode display layer having pixels.

17. The display defined in claim 16 wherein the lubrication layer comprises oil.

18. The display defined in claim 15 wherein the lubrication layer comprises a liquid lubricant and wherein the first layer has a textured surface in contact with the liquid lubricant.

19. An electronic device, comprising:
- a housing;
- a display mounted in the housing, wherein the display comprises:
  - first, second, third and fourth layers; and
  - a first lubrication layer between the first and third layers, a second lubrication layer between the second and third layers, and a third lubrication layer between the third and fourth layers, wherein the first, second, and third lubrication layers include at least one structure selected from the group consisting of: a fluoropolymer coating, a textured surface, and a liquid lubricant; and
- first and second gaskets that hold the display in place within the housing, wherein the first, second, third, and fourth layers extend between the first and second gaskets, wherein the display has an upper surface on which images are displayed, a lower surface opposite the upper surface, and an edge interposed between the upper and lower surfaces, wherein the first and second gaskets are separated by a gap that extends along the edge of the display, and wherein the first, second, third, and fourth layers shift within the gap.

* * * * *